(12) United States Patent
Levilly et al.

(10) Patent No.: US 10,727,830 B2
(45) Date of Patent: Jul. 28, 2020

(54) X-RAY TUBE POWER SUPPLY INVERTER SWITCH

(71) Applicant: GENERAL ELECTRIC COMPANY, Schenectady, NY (US)

(72) Inventors: Nicolas Levilly, Buc (FR); Denis Perrilliat-Amede, Paris (FR); Patrick Feat, Paris (FR); Daniel Dumourier, Levallois-Perret (FR); Elie Herve, Palaiseau (FR)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 560 days.

(21) Appl. No.: 15/103,625

(22) PCT Filed: Sep. 10, 2014

(86) PCT No.: PCT/US2014/054980
§ 371 (c)(1),
(2) Date: Jun. 10, 2016

(87) PCT Pub. No.: WO2015/099844
PCT Pub. Date: Jul. 2, 2015

(65) Prior Publication Data
US 2016/0315606 A1 Oct. 27, 2016

(30) Foreign Application Priority Data
Dec. 23, 2013 (FR) ...................................... 13 63466

(51) Int. Cl.
*H03K 17/12* (2006.01)
*H02M 7/00* (2006.01)
(Continued)

(52) U.S. Cl.
CPC .......... *H03K 17/122* (2013.01); *H02M 7/003* (2013.01); *H05G 1/10* (2013.01); *H01L 23/34* (2013.01); *H05K 7/20927* (2013.01)

(58) Field of Classification Search
CPC ..... H02M 7/003; H01L 23/24; H05K 7/20927
See application file for complete search history.

(56) References Cited

U.S. PATENT DOCUMENTS 5,243,230 A * 9/1993 Itou ........................ H01S 3/031
307/125
7,721,232 B2 5/2010 Ejury
(Continued)

FOREIGN PATENT DOCUMENTS

CN 101241910 A 8/2008
WO 2013021647 A1 2/2013

OTHER PUBLICATIONS

Machine Translation and First Office Action and Search issued in connection with corresponding CN Application No. 201480070674.7 dated Nov. 1, 2017.
(Continued)

*Primary Examiner* — Kyle J Moody
*Assistant Examiner* — Lakaisha Jackson
(74) *Attorney, Agent, or Firm* — Grogan, Tuccillo & Vanderleeden, LLP (57) ABSTRACT

A switch of an inverter of an X-ray tube power supply including: at least four MOSFETs aligned in parallel; a plurality of intermediate radiators positioned between the MOSFETs in order to separate two successive MOSFETs; at least four snubbers positioned in parallel, each being positioned beside a MOSFET; a control unit of said switch positioned so that the succession of MOSFETs is positioned between the alignment of snubbers and the control unit.

9 Claims, 6 Drawing Sheets

(51) Int. Cl.
*H05G 1/10* (2006.01)
*H05K 7/20* (2006.01)
*H01L 23/34* (2006.01)

(56) References Cited

U.S. PATENT DOCUMENTS

| | | | | |
|---|---|---|---|---|
| 8,502,735 | B1* | 8/2013 | Moosbrugger | H01Q 3/30 |
| | | | | 343/700 MS |
| 2013/0163726 | A1* | 6/2013 | Kuroki | H05G 1/10 |
| | | | | 378/103 |
| 2016/0181836 | A1* | 6/2016 | Kanabe | H02J 7/00 |
| | | | | 320/118 |

OTHER PUBLICATIONS

International Search Report and Written Opinion for PCT/US2014/054980, dated Mar. 27, 2015, 10 pages.

\* cited by examiner

X-RAY TUBE POWER SUPPLY INVERTER SWITCH

CROSS-REFERENCE TO RELATED APPLICATIONS

This application is a PCT National Phase filing under 35 U.S.C. 371 of International (PCT) Application No. PCT/US2014/054980, filed Sep. 10, 2014, which claims priority to French Application No. 1363466, filed Dec. 23, 2016, both of which are incorporated by reference herein in their entireties.

TECHNICAL FIELD

The exemplary non-limiting embodiments described herein relate to X-ray tube power supplies comprising an inverter and, in some cases, an inverter switch.

BACKGROUND

Metal Oxide Semiconductor Field Effect Transistor, (MOSFET) are widely used in semiconductor devices in which switching functions are used, notably inverter switches. Such components are assembled on printed circuits which, depending on the desired application, are of limited size. X-ray tube power supply inverters are known, applying at least one switch with two MOSFETs positioned side by side on a printed circuit.

One problem is that the switching functions require high performances (high operating frequencies, increasingly short transient phases) notably when they are used in such inverters. Thus, it is desirable to be able to position several MOSFETs on a printed circuit in order to improve performances.

BRIEF DESCRIPTION

According to an exemplary non-limiting embodiment, a switch of an inverter for an X-ray tube power supply comprises: at least two MOSFETs aligned in parallel; at least one intermediate radiator positioned between the MOSFETs in order to separate two successive MOSFETs; at least two snubbers positioned in parallel, each being positioned beside a MOSFET; a control unit of said switch positioned so that the succession of MOSFETs is positioned between the alignment snubbers and the control unit.

Some exemplary non-limiting embodiments comprise one or more of following features, taken alone or in any of their technically possible combinations as recognized by one of ordinary skill in the art: each intermediate radiator comprises a first portion separating the MOSFETs pairwise and a second portion extending and protruding from the first portion, the second portion being laid out so as to be positioned above the alignment of snubbers; it comprises two rectangular extreme radiators positioned for sandwiching the intermediate radiators, the snubbers, the control unit and the MOSFETs; it comprises a damping device positioned on one intermediate or extreme radiator face so as to maintain the contact between the MOSFET adjacent to this face with the following intermediate or extreme radiator; the damping device is in silicone or else is a metal strip; it comprises two screws connecting together the intermediate or extreme radiators, one being such that it crosses the intermediate radiators on the first portion and the other one on the second portion; the screw of the first portion is at the height of the snubbers; the intermediate or extreme radiators are of the same thicknesses, typically comprised between 3 and 10 mm, typically 6 mm; each extreme radiator comprises two attachment orifices so as to attach said extreme radiators onto a printed circuit.

The advantages of the exemplary non-limiting embodiments described herein are multiple.

By the structure an exemplary non-limiting embodiment of the switch, it is possible to position the MOSFETs in parallel by having a distance of 11 mm between them versus 23 mm in inverters of the state of the art. Thus, it is possible to position a larger number of switches on a same printed circuit.

The exemplary non-limiting embodiments make possible the use of MOSFETs as a power switch for an inverter with a very intense current (>500 peak A), and consequently the making of an inverter with both a very intense current and a very high maximum frequency (300 kHz). Indeed, normally, the notion of a very intense current implies the selection of IGBTs instead of MOSFETs, and therefore with a low frequency of use therefore generating substantial volume and cost of magnetic components.

The exemplary non-limiting embodiments give the possibility of maximizing the current breaking capability of the power switch which is very advantageous in the case of an X-ray inverter wherein the power/current peak are major characteristics.

The exemplary non-limiting embodiments minimize the overvoltage on the terminals of the power switch when it is opened, allowing the selection of a switch for which the voltage capability is not too high relatively to the rated voltage of use and which will therefore have better conduction performances.

The exemplary non-limiting embodiments give the possibility of maximizing the volume of snubber capacitors and therefore their capability in effective current and voltage of use, without however having to increase the length of the parasitic connections.

The exemplary non-limiting embodiments give the possibility of optimizing the routing of the printed circuit in the area of the control circuit, so as to allow maximum robustness upon the opening of the switch with a highly intense current.

The exemplary non-limiting embodiments give the possibility of optimizing thermal dissipation (one fin per power transistor, a large exchange surface area with the air blown by a nearby fan).

The exemplary non-limiting embodiments give the possibility of optimizing the solderability of the printed circuit by selecting an assembly of copper planes allowing wave soldering compatible with the manufacturing standard IPC610A recommendation.

Depending on the application, the exemplary non-limiting embodiments allow modulation, in an inverter, of the number of switches and snubbers according to the application.

BRIEF DESCRIPTION OF THE DRAWINGS

Other features, objects and advantages of the exemplary non-limiting embodiments will become apparent from the description which follows, which is purely illustrative and non-limiting, and which should be read with reference to the appended drawings wherein.

On the whole of the figures, similar elements bear identical references.

DETAILED DESCRIPTION

Figure 1:
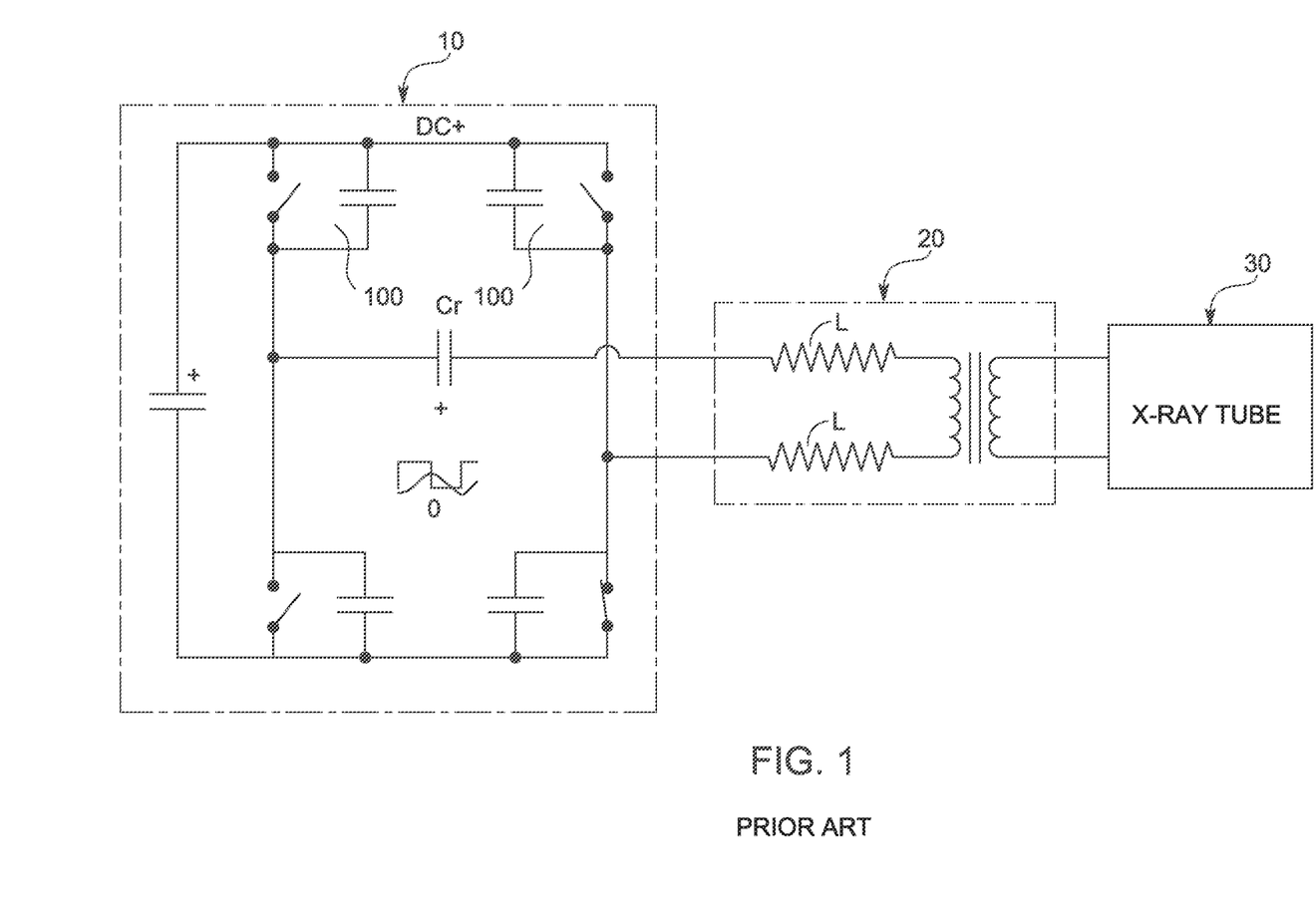
FIG. 1 illustrates an electric diagram of a power supply for an X-ray tube.

In FIG. 1, an X-ray tube power supply is illustrated, comprising an inverter 10 connected to a high-voltage transformer 20 which is connected to an X-ray tube 30. The inverter comprises at least one switch 100.

Figure 2:
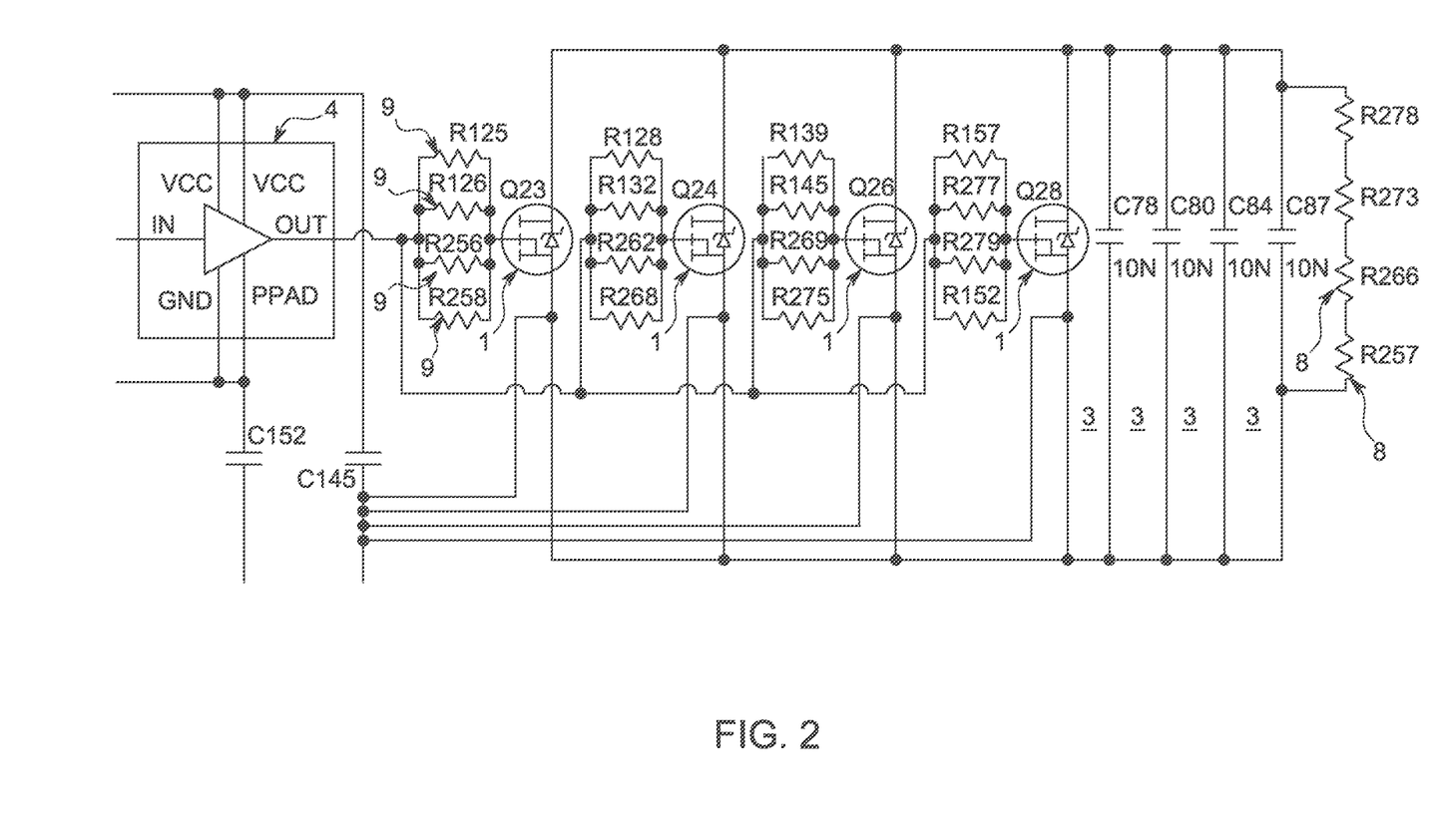
FIG. 2 illustrates an electric diagram of a switch according to an exemplary non-limiting embodiment.

In connection with FIG. 2, a switch of an inverter of an X-ray tube power supply essentially comprises several MOSFETs 1, snubbers 3 (i.e. capacitors for assisting switching) in a number identical with the number of MOSFETs 1, and a control unit 4 configured for driving the various components of the switch.

According to an exemplary non-limiting embodiment, the structure of such a switch is such that it comprises (see FIGS. 3, 4, 5 and 6): four MOSFETs 1 aligned in parallel; several intermediate radiators 2 positioned between the MOSFETs 1 for separating two successive MOSFETs 1, so as to typically form an alternation of MOSFETs 1 and of intermediate radiators 2; four snubbers 3 positioned in parallel, each being positioned beside a MOSFET 1.

Figure 3:
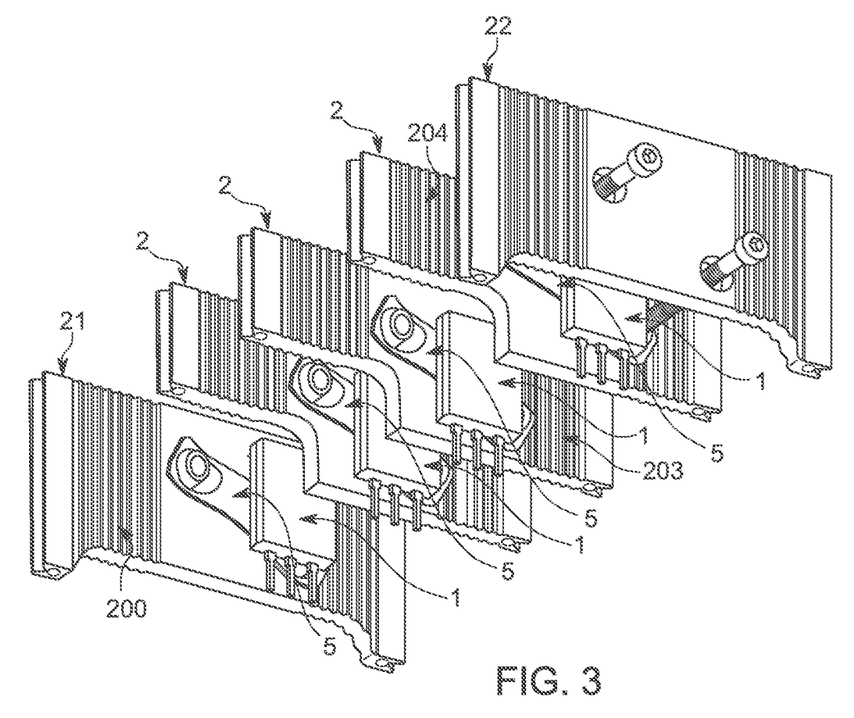
FIG. 3 illustrates an exploded perspective view of a portion of a switch according to an exemplary non-limiting embodiment.
Figure 4:
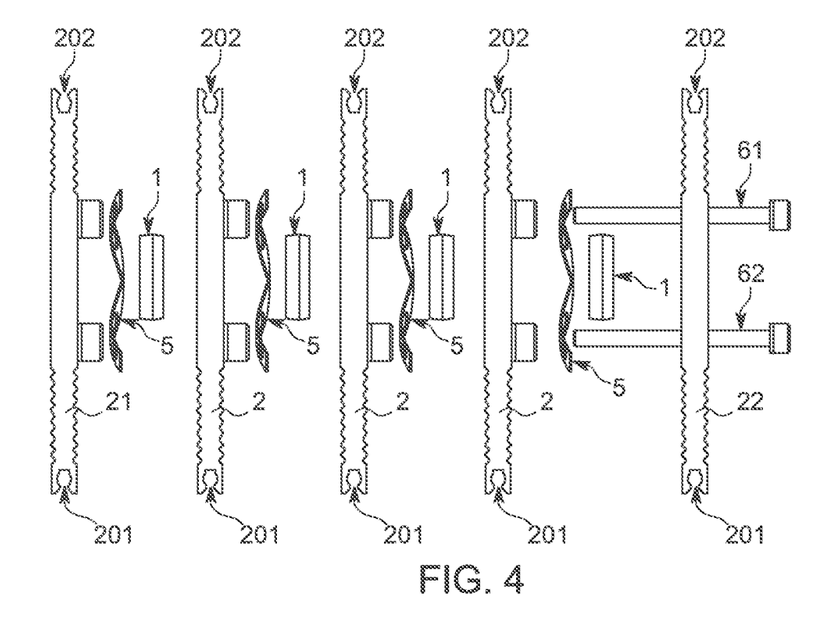
FIG. 4 illustrates an exploded bottom view of a portion of a switch according to an exemplary non-limiting embodiment.
Figure 5:
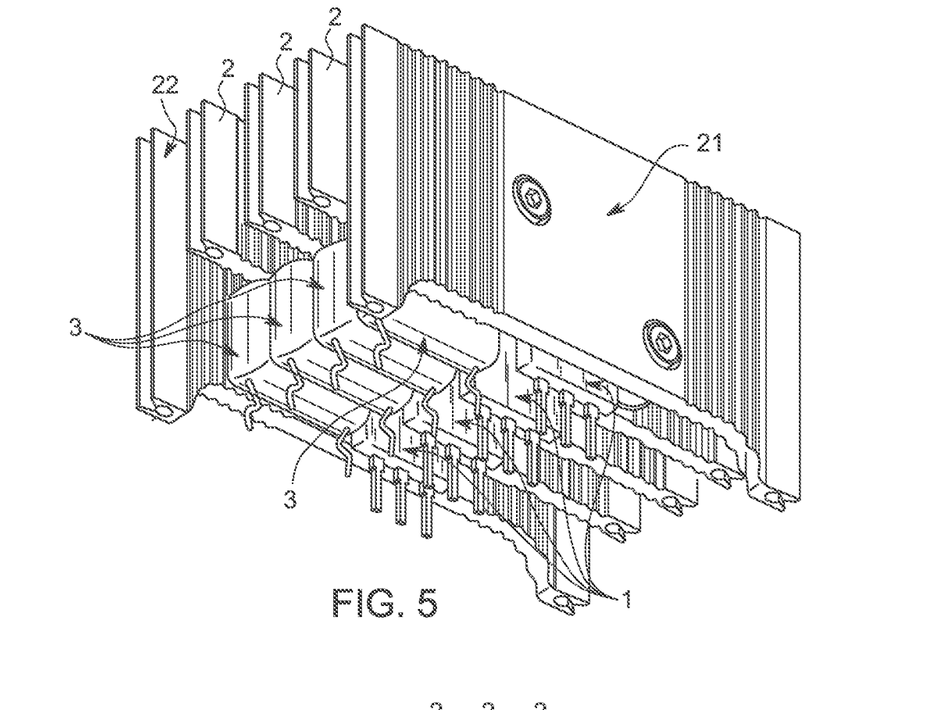
FIG. 5 illustrates a perspective view of a switch according to an exemplary non-limiting embodiment.
Figure 6:
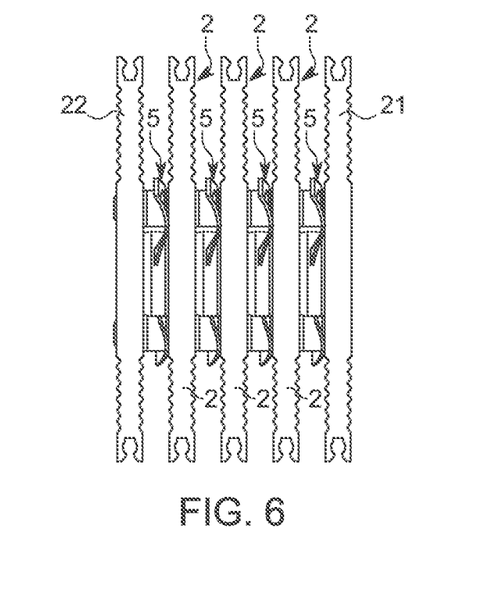
FIG. 6 illustrates a bottom view of a switch according to an exemplary non-limiting embodiment.

Further, the switch comprises a control unit 4 of the switch positioned so that the succession of MOSFETs 1 is positioned between the alignment of snubbers 3 and the control unit 4 (it should be noted that the snubbers 3, for the sake of clarity, have been omitted in FIGS. 3 and 4).

In a complementary manner, the switch comprises two extreme radiators 21, 22, of a general rectangular shape, positioned so as to sandwich the intermediate radiators 2, the control unit 4 and the snubbers 3. Both extreme radiators 21 and 22 are thus typically positioned on either side of the alternation of intermediate radiators 2 and of MOSFETs 1, preferentially so that one MOSFET 1 is positioned between each of the extreme radiators 21 and 22 and the intermediate radiator 2 positioned opposite thereto.

Each intermediate radiator 2 comprises a first portion 203 separating the MOSFETs 1 pairwise and a second portion 204 extending and protruding from the first portion 203, the second portion 204 being laid out so as to be positioned above the alignment of snubbers 3. Thus both portions 203 and 204 of an intermediate radiator 2 have the general shape of an L.

The radiators are preferably in aluminum and of the same thickness. Further, in order to promote dissipation of heat, they preferably comprise machined grooves 200 on each of the faces of the radiators.

The extreme 21, 22 and intermediate 2 radiators are intended for dissipating heat generated by the MOSFETs 1, thus a controlled and intimate contact between the MOSFET 1 and the extreme radiator 21 or 22 or the intermediate radiator 2 in contact should be ensured. To do this, the switch comprises several damping devices 5. Each damping device 5 is positioned on an intermediate radiator 2 or extreme radiator 21 or 22 so as to maintain the contact between the MOSFET 1 with the following intermediate radiator 2 or extreme radiator 21 or 22.

Preferably, the damping device 5 is a metal strip (as illustrated in the figures). Alternatively, the damping device 5 may be a silicone pellet (not shown).

In order to hold les different elements of the switch together, the latter comprises two screws 61, 62 connecting together the intermediate 2 and extreme 21,22 radiators.

A screw 61 is such that it crosses the extreme 21,22 and intermediate 2 radiators at the first portion 203 of an intermediate radiator 2 and the other screw 62 at the second portion 204 of an intermediate radiator.

Thus the screw 62 which crosses the intermediate 2 and extreme 21,22 radiators at the second portion 204 is positioned above the snubbers 3 relatively to the surface of the printed circuit 7 onto which the switch is able to be attached.

Preferably, as illustrated, the screw 61 which crosses the extreme and intermediate radiators at the first portion is at a lower height than that of the screw 62, preferentially at the height of the snubbers 3. It is thus possible to obtain a more robust attachment. The switch and therefore all its components are intended to be attached onto a printed circuit, typically onto a printed circuit 7. To do this, each radiator (intermediate 2 or extreme 21, 22 radiator) comprises two attachment orifices 201, 202 into which screws are intended to be inserted.

Thus the switch described above consists of the succession of the following elements: a first extreme radiator 21, a first MOSFET 1, a first damping device 5, a first intermediate radiator 2, a second MOSFET 1, a second damping device 5, a second intermediate radiator 2, a third MOSFET 1, a third damping device 5, a third intermediate radiator 2, a fourth MOSFET 1, a fourth damping device 5, a second extreme radiator 22.

Figure 7:
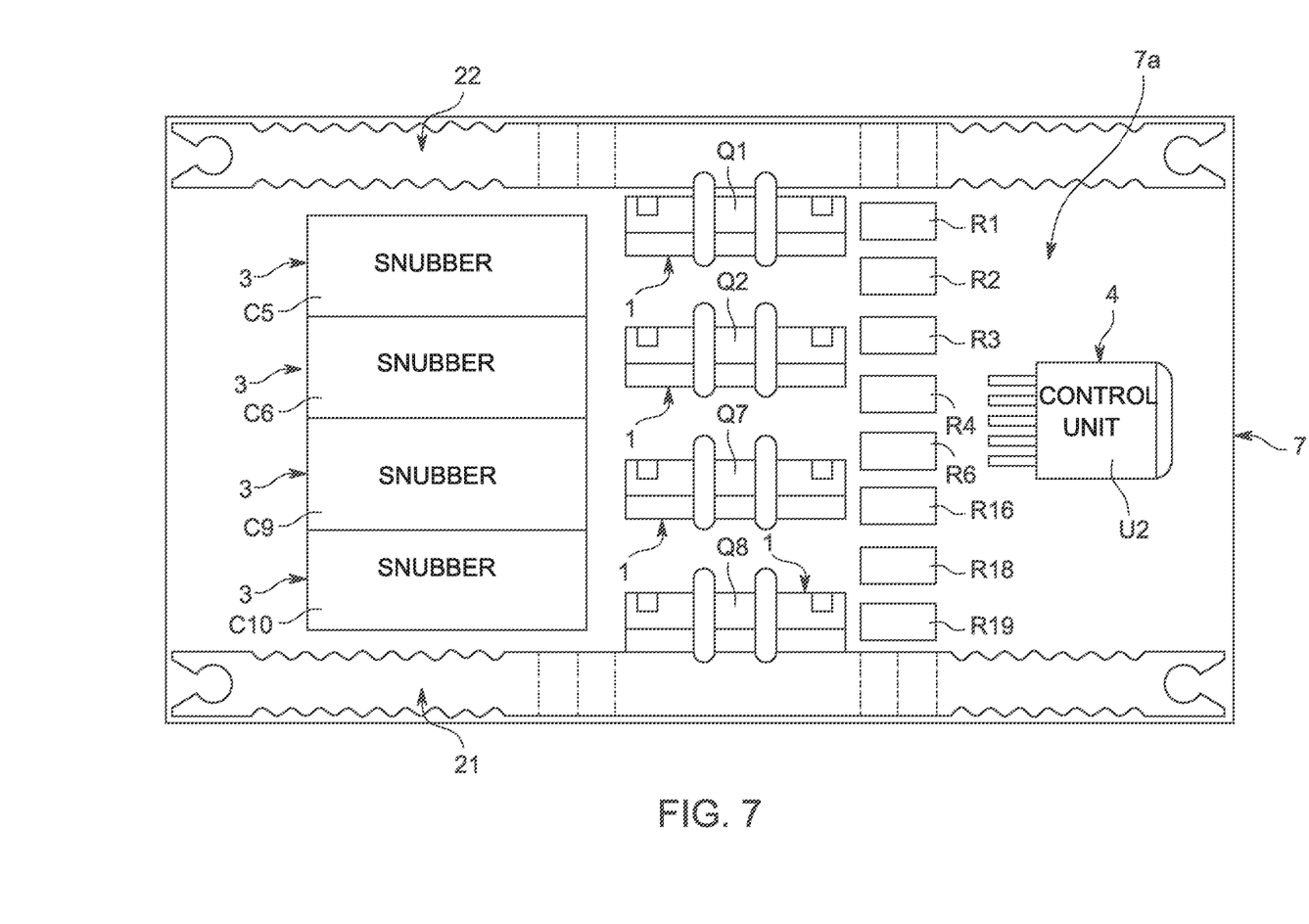
FIG. 7 illustrates a top view of an implementation of a switch according to an exemplary non-limiting embodiment.

A top view of the implementation of the components of the switch on the printed circuit 7 is illustrated in FIG. 7. In this figure, for the sake of clarity, the intermediate radiators 2 have been omitted.

In this figure, the implementation of the components on the upper face 7a of the printed circuit 7 is notably illustrated.

In FIG. 7, a bottom view is illustrated, of the locations of the connections of the different components of the switch as seen from the lower face 7b of the printed circuit 7.

Still in this figure, the positions of the pins B1 of the MOSFETs, the positions of the bridge resistors (gate) R163, R165, R166, R169, R171, R178, R179, R181 and of the balancing resistors R164, R168, R173, R180 which are localized below the snubbers (and therefore not visible in the previous figures) are illustrated.

Oval holes 71 are also illustrated in this figure, which are used for maintaining the required insulation distances in order to meet the medical standards for designing printed circuits.

Figure 8:
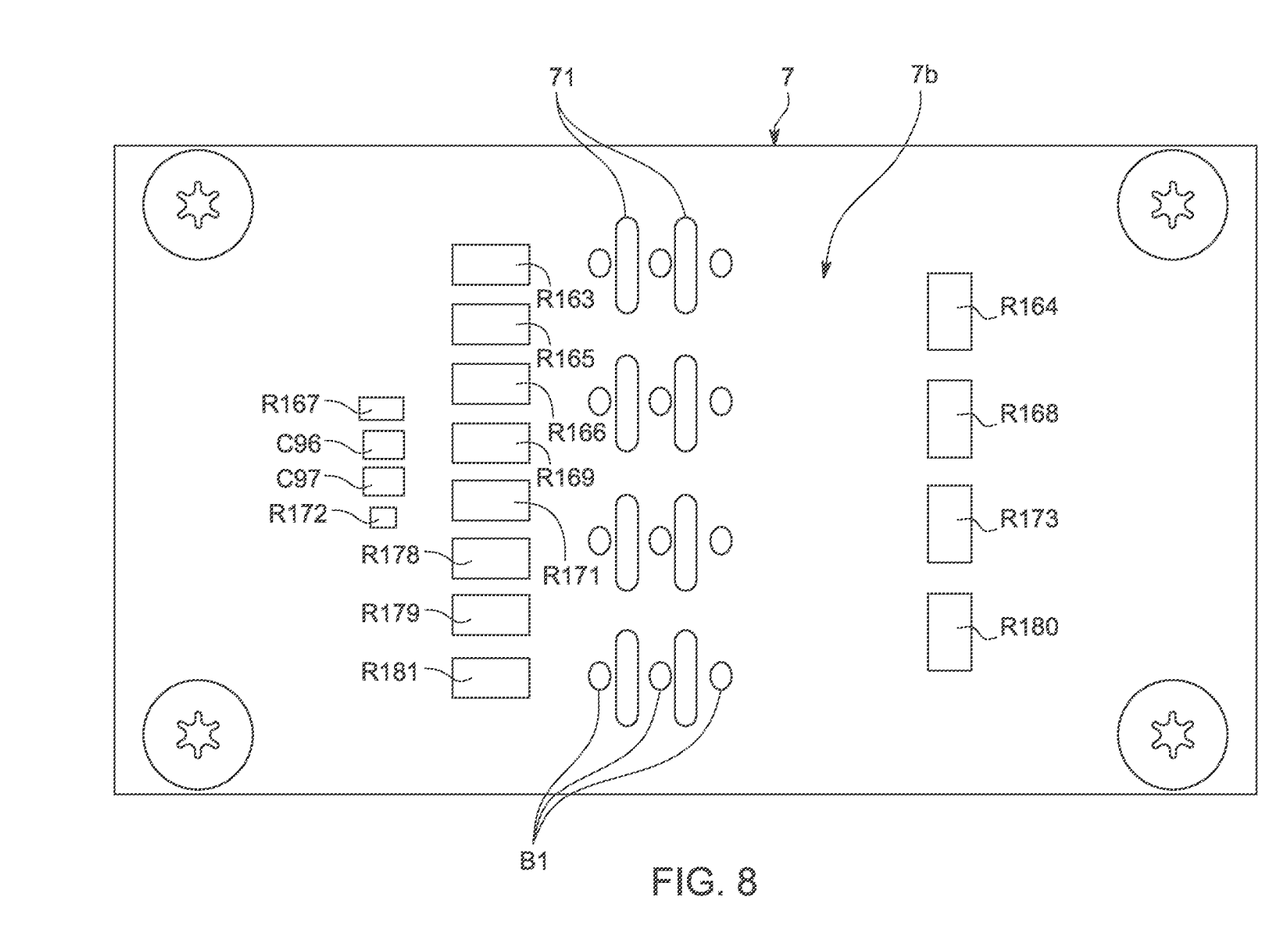
FIG. 8 illustrates a bottom view of an implementation of a switch according to an exemplary non-limiting embodiment.

As this may be seen from FIGS. 7 and 8, with the implementation of the different components of the switch, it is possible to obtain a compact structure of the switch, which facilitates its integration into an inverter.

Further this compactness simplifies the connections of the different components.

Further, for facilitating the connections, the thickness of the printed circuit 7 is used. In this respect, the printed circuit comprises eight copper layers allowing the use of the whole thickness of the printed circuit for making connections of the different components with one another without any overlapping of the latter.

What is claimed is:

1. A switch of an inverter of an X-ray tube power supply, comprising:
    a single printed circuit on which is attached:
        at least two MOSFETs aligned in parallel;
        at least one intermediate radiator positioned between the at least two MOSFETs in order to separate two successive MOSFETs;
        at least two snubbers positioned in parallel, each being positioned adjacent a respective one of the at least two MOSFETs;
        a control unit of said switch positioned so that a succession of MOSFETs is positioned between the alignment of the at least two snubbers and the control unit; and,
        two extreme radiators positioned for sandwiching the at least one intermediate radiator, the at least two snubbers, the control unit and the at least two MOSFETs, wherein the at least two snubbers overlap the at least one intermediate radiator within a space between to the two extreme radiators.

2. The switch according to claim 1, wherein the at least one intermediate radiator comprises a first portion separating the at least two MOSFETs pairwise and a second portion extending and protruding from the first portion, the second portion being laid out so as to be positioned above the alignment of the at least two snubbers.

3. An inverter of a power supply of an X-ray tube comprising a plurality of switches according to claim 1.

4. The switch according to claim 1, further comprising a damping device positioned on a surface of at least one of the at least one intermediate radiator or a surface of at least one of the two extreme radiators so as to maintain the at least two MOSFETs in contact with the respective intermediate or extreme radiators.

5. The switch according to claim 4, wherein the damping device is in silicone or is a metal strip.

6. The switch according to claim 1, further comprising two screws connecting together the at least one intermediate radiator and the two extreme radiators, one of the two screws crossing a first portion of the at least one intermediate radiator and the other of the two screws crossing a second portion of the at least one intermediate radiator.

7. The switch according to claim 6, wherein the screw crossing the first portion is positioned above the at least two snubbers relative to a surface of the printed circuit.

8. The switch according to claim 1, wherein the two extreme radiators and the at least one intermediate radiator are of the same thicknesses.

9. The switch according to claim 1, wherein each of the two extreme radiators comprises two attachment orifices so as to attach said two extreme radiators onto a printed circuit.

* * * * *